US006418026B1

(12) United States Patent
Ho et al.

(10) Patent No.: US 6,418,026 B1
(45) Date of Patent: Jul. 9, 2002

(54) BUS RACK FOR ACCOMMODATING PLURAL STAND-ALONE COMPUTERS

(75) Inventors: Raymond K. Ho, San Jose; Richard R. Creason, Palo Alto; Victor E. Jochiong, Mill Valley, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/824,467

(22) Filed: Apr. 2, 2001

(51) Int. Cl.[7] ................................................ H05K 7/20
(52) U.S. Cl. .................... 361/727; 361/704; 360/98.01; 364/708.1
(58) Field of Search ................................. 361/727, 700, 361/704, 707, 685–687, 724–726; 360/97.01, 97.03, 98.01, 98.03; 364/708.1

(56) References Cited

U.S. PATENT DOCUMENTS

| 5,233,594 A | * | 8/1993 | Wilhelm ................... 360/98.01 |
| 5,912,799 A | * | 6/1999 | Grouell et al. .............. 361/685 |
| 6,272,016 B1 | * | 8/2001 | Matonis et al. ............. 361/716 |

* cited by examiner

Primary Examiner—Darren Schuberg
Assistant Examiner—Hung Van Duong
(74) Attorney, Agent, or Firm—O'Melveny & Myers LLP

(57) ABSTRACT

The present invention includes a computer bus rack having a circuit board for accommodating a plurality of stand-alone computers. The circuit board has a front side and a back side, and the rack comprises a first plurality of slots coupled to the front side, and a second plurality of slots coupled to the back side. The first and second plurality of slots are arranged such that corresponding ones of the first and second plurality of slots are in alignment together. Also, a plurality of connectors are affixed to the circuit board in alignment with the first and second plurality of slots, and have respective pass-through connector-pins that extend into each of the first and second slots, wherein certain ones of the connector-pins allocated to carry power signals are commonly connected for each of the plurality of connectors, and remaining ones of the connector-pins with respect to a particular slot are electrically isolated from connector-pins with respect to another slot on the same one of the front side and the back side. Because the connector-pins of the slots in the present invention are not electrically connected to each other, except for the connector-pins carrying power signals, each slot acts as an isolated bus. This allows an independent stand-alone computer to be coupled to each slot of the circuit board.

16 Claims, 7 Drawing Sheets

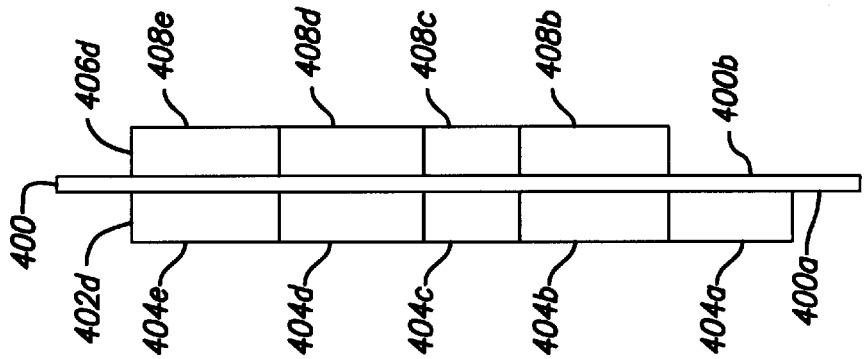
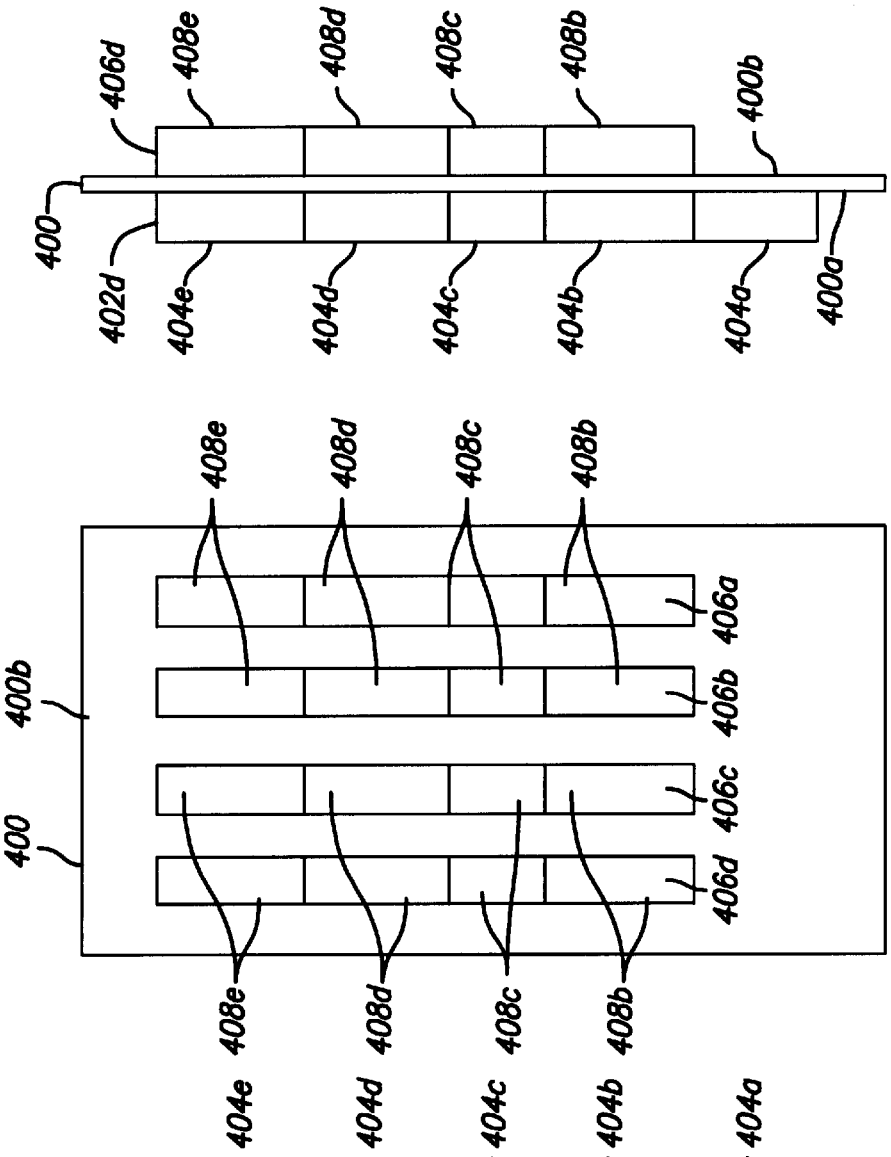
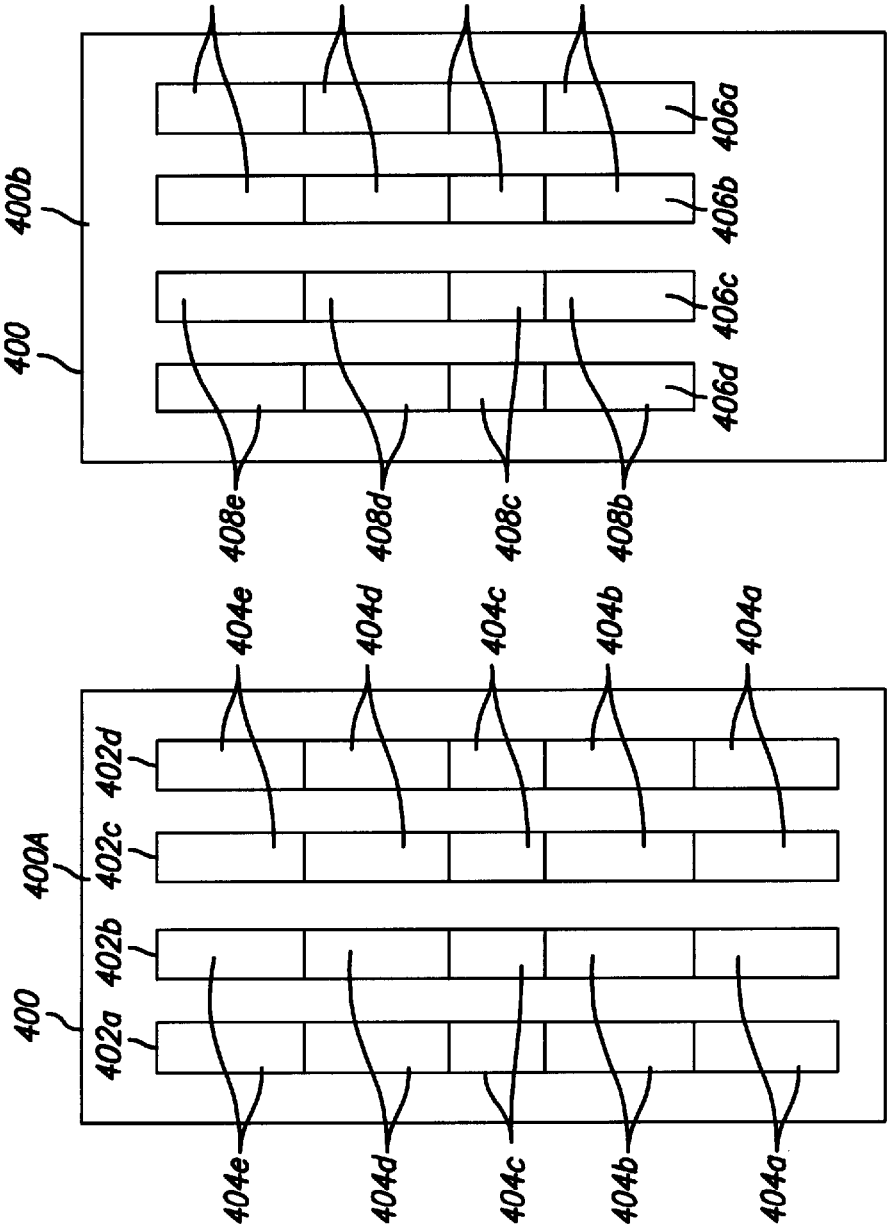

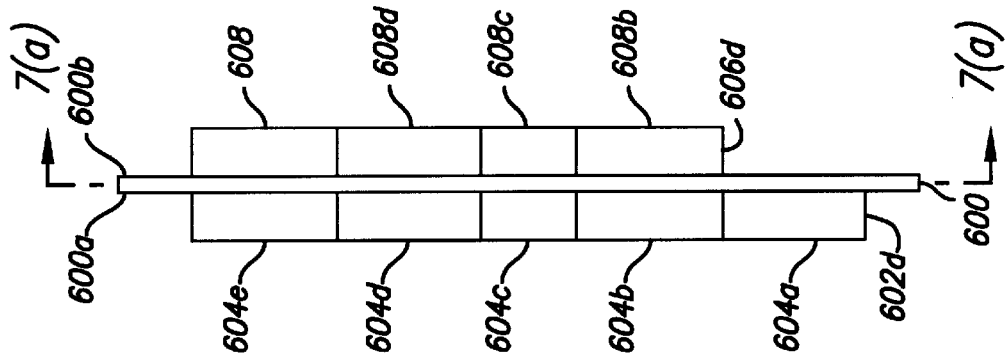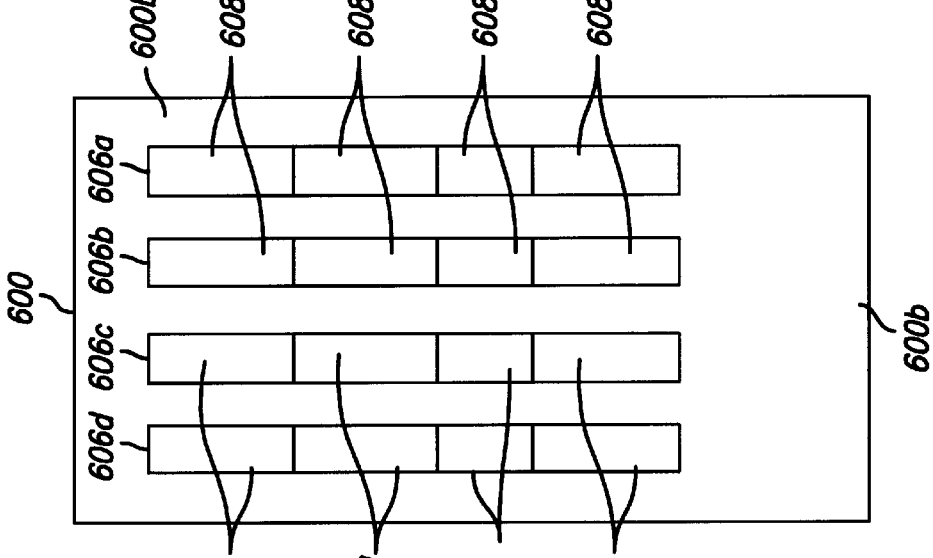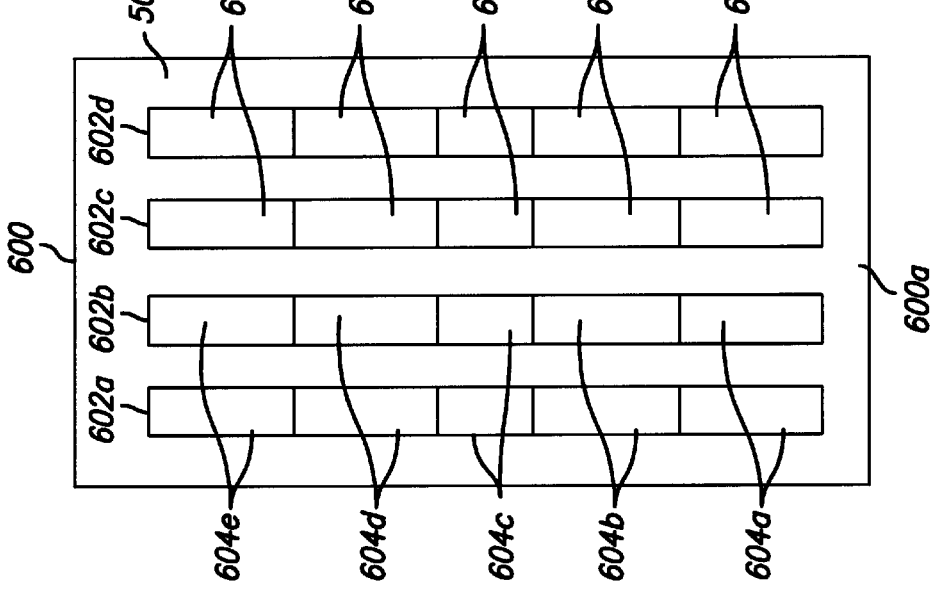

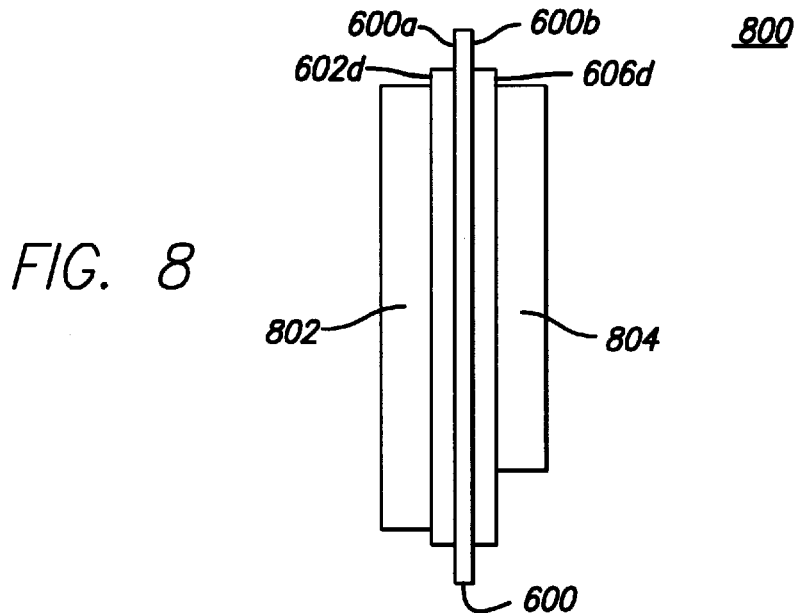
FIG. 8
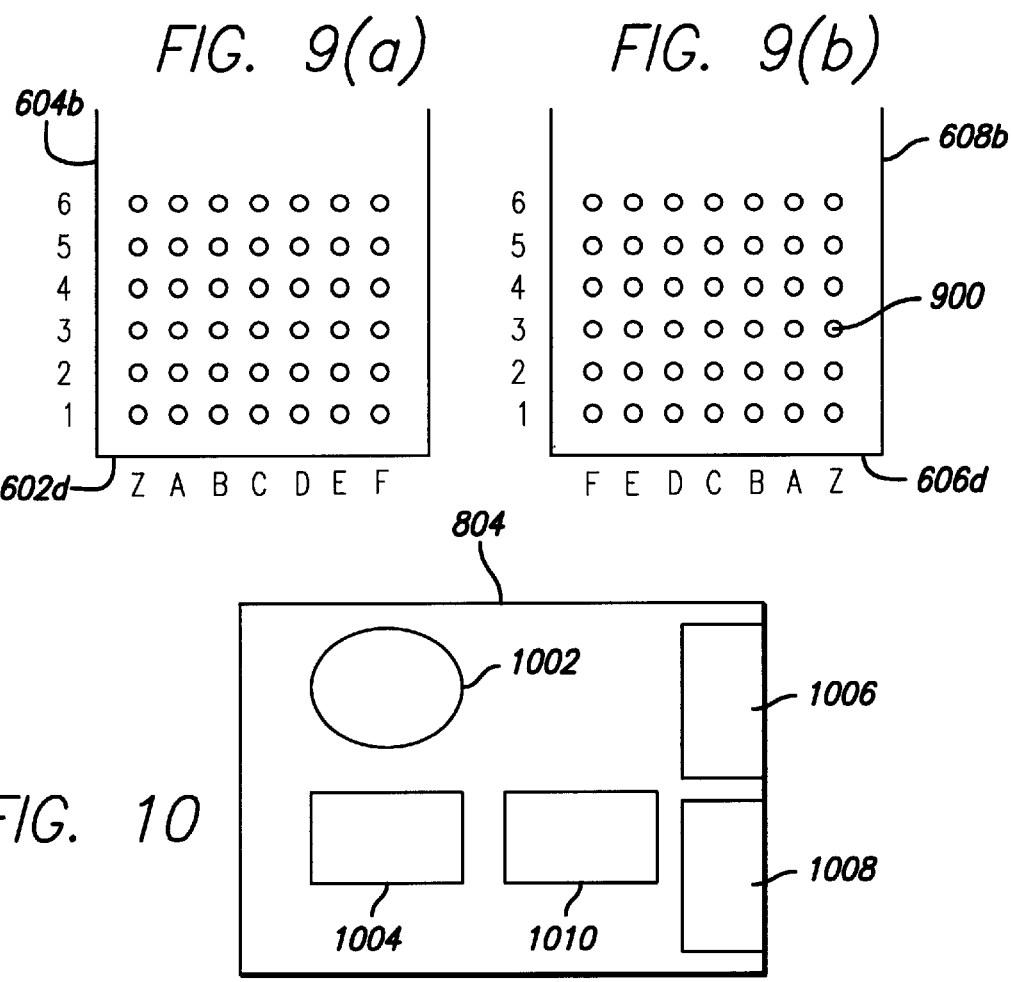
FIG. 9(a)      FIG. 9(b)
FIG. 10

BUS RACK FOR ACCOMMODATING PLURAL STAND-ALONE COMPUTERS

BACKGROUND OF THE INVENTION

1. Field of the Invention

The present invention relates to a Compact Peripheral Component Interconnect ("CPCI") computer system. More specifically, the present invention relates to a bus rack for accommodating a plurality of stand-alone computers.

2. Description of Related Art

Compact Peripheral Component Interconnect ("CPCI") is a high performance industrial bus based on the standard PCI electrical specification in rugged 3U or 6U Eurocard packaging. CPCI is intended for application in telecommunications, computer telephony, real-time machine control, industrial automation, real-time data acquisition, instrumentation, military systems or any other application requiring high speed computing, modular and robust packaging design, and long term manufacturer support. Because of its extremely high speed and bandwidth, the CPCI bus is particularly well suited for many high-speed data communication applications such as servers, routers, converters, and switches.

Compared to standard desktop PCI, CPCI supports twice as many PCI slots (8 versus 4) and offers a packaging scheme that is much better suited for use in industrial applications. Conventional CPCI cards are designed for front loading and removal from a card cage. The cards are firmly held in position by their connector, card guides on both sides, and a faceplate that solidly screws into the card cage. Cards are mounted vertically allowing for natural or forced convection for cooling. Also, the pin-and-socket connector of the CPCI card is significantly more reliable and has better shock and vibration characteristics than the card edge connector of the standard PCI cards.

Conventional CPCI defines a backplane environment that is limited to eight slots. One slot, the system slot, provides the clocking, arbitration, configuration, and interrupt processing for the other seven slots. Accordingly, the conventional CPCI system is limited to only one stand-alone computer since only the system slot is adapted to receive a CPU daughter card, and the other peripheral slots are reserved for peripheral daughter cards. However, many applications require larger systems so that it would be advantageous to provide multiple stand-alone computers in a CPCI system.

SUMMARY OF THE INVENTION

The present invention provides a computer bus rack that is able to accommodate a plurality of stand-alone computers, which are comprised of CPU cards that are inserted into the slots of the bus rack. The inserted CPU cards operate independently with respect to one another so that there is independent operation of the stand-alone computers. By allowing for the independent operation of multiple stand-alone computers, the present invention is able to provide the advantages of, for example, pure multitasking, parallel processing, redundancy, mirroring, back-up, and more computing power for a given board size.

The computer bus rack includes a circuit board, which is called a midplane in the present invention. The circuit board is referred to as a backplane or midplane depending on its placement in the computer chassis, which is significant. For example, if the circuit board is located at the back of the chassis so that it is a backplane, then it will allow the insertion of "add-on" cards only from the front side, whereas a circuit board that is located at the middle of the chassis allows for the insertion of add-on cards from both sides—front and back. In the present invention, the circuit board is referred to as the midplane, while the conventional circuit board is referred to as the backplane.

In an embodiment of the invention, a computer bus rack has a circuit board for accommodating a plurality of stand-alone computers. The circuit board has a front side and a back side, and the rack comprises a first plurality of slots coupled to the front side, and a second plurality of slots coupled to said back side. The first and second of slots are arranged such that corresponding ones of the first and second slots are in alignment together so as to be back to back. Also, a plurality of connectors are affixed to the circuit board in alignment with the first and second plurality of slots, and have respective pass-through connector-pins that extend into each of the first and second slots, wherein certain ones of the connector-pins allocated to carry power signals are commonly connected for each of the plurality of connectors, and remaining ones of the connector-pins with respect to a particular slot are electrically isolated from connector-pins with respect to another slot on the same one of the front side and the back side.

In another embodiment of the invention, a computer system has a plurality of stand-alone computers coupled to a common circuit board, with the circuit board having a front side and a back side. The front and back sides have a plurality of slots including a plurality of connectors, with the computer system comprising a plurality of CPU daughter cards pluggable in the slots of the front side and corresponding I/O transition cards pluggable in the slots of the back side. Power signals are shared by each of the plurality of connectors of each slot, and I/O signals are only transmitted between the daughter cards on the front side and the corresponding I/O transition card on the back side.

Because the connector-pins of the slots in the midplane are not electrically connected to one another, except for the power signals, each is an "isolated" bus. For example, for a given slot, only certain connector-pins transmit I/O signals, and the other connector-pins carry power signals. The connector-pins that transmit I/O signals are isolated electrically from the connector-pins of the other slots of the circuit board, whereas the connector-pins that transmit power signals are electrically connected to the connector-pins of the other slots. Thus, when a CPU card is inserted in a slot of the midplane, the I/O signals are only transmitted between the CPU card and the I/O transition card that is inserted in the corresponding slot that is on the other side of the midplane, whereas the power signals are shared with all the other slots. This allows multiple CPU cards to be inserted in the slots of the same midplane, yet operate independently. Thus, a plurality of stand-alone computers can be provided in a single midplane of the present invention. Accordingly, the midplane is able to accommodate stand-alone computers that may be used independently so as to realize the advantages of, for example, pure multitasking, parallel processing, redundancy, mirroring, back-up, or more computing power for a given board size.

A more complete understanding of the present invention will be afforded to those skilled in the art, as well as a realization of additional advantages and objects thereof, by a consideration of the following detailed description of the preferred embodiments. Reference will be made to the appended sheets of drawings, which will first be described briefly.

BRIEF DESCRIPTION OF THE DRAWINGS

FIG. 4(a) shows a front view of a conventional CPCI backplane in the 6U form factor;

FIG. 4(b) shows a back view of a conventional CPCI backplane in the 6U form factor;

FIG. 5 shows a side view of the conventional backplane of FIGS. 4(a) and 4(b);

FIG. 6(a) shows a front view of a midplane according to an embodiment of the invention;

FIG. 6(b) shows a back view of a midplane according to an embodiment of the invention;

FIG. 7 shows a side view of the midplane of FIGS. 6(a) and 6(b);

FIG. 8 shows a stand-alone computer in a slot of the midplane of FIG. 7;

FIGS. 9(a) and 9(b) show the arrangement of the connector-pins of the front side and back side connectors according to an embodiment of the invention; and FIG. 10 shows the components of an I/O transition card according to an embodiment of the invention.

DETAILED DESCRIPTION

The present invention provides a bus rack including a circuit board that is able to accommodate a plurality of stand-alone computers. Advantages of providing multiple stand-alone computers coupled to a single circuit board include multitasking, parallel processing, redundancy, mirroring, back-up, and more computing power for a given board size, which is required for more powerful applications.

Figure 1:
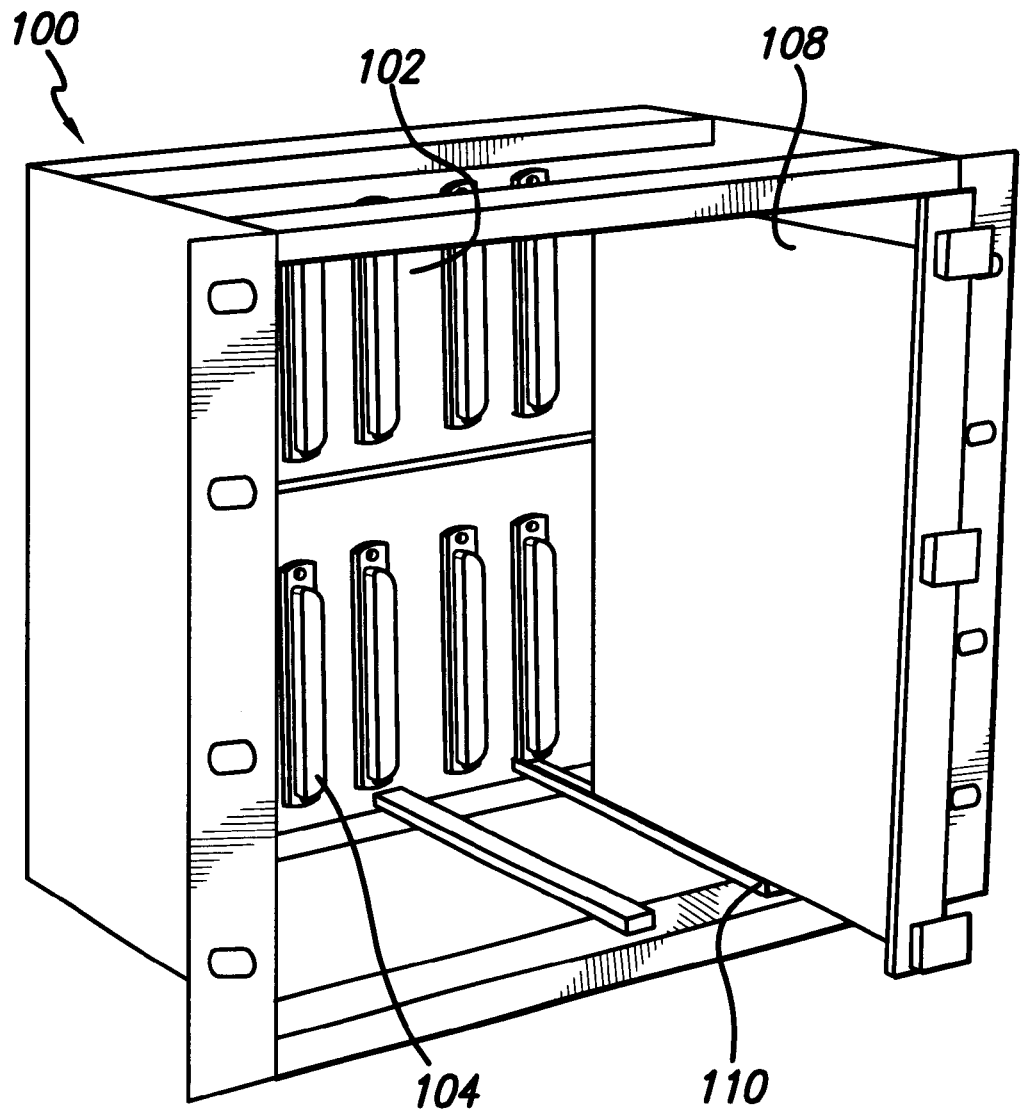
FIG. 1 is a perspective view of a conventional CPCI chassis system.

Referring to FIG. 1, there is shown a perspective view of a conventional CPCI chassis system. The chassis system 100 includes a CPCI circuit board referred to in the conventional CPCI system as a passive backplane 102 since the circuit board is located at the back of the chassis 100 and add-on cards can only be inserted from the front of the chassis 100. On the front side of the backplane 102 are slots provided with connectors 104. In the conventional chassis system 100 that is shown, a daughter card 108 may be inserted into appropriate slots and mate with the connectors 104. For proper insertion of the daughter cards 108 into the slots, card guides 110 are provided. This conventional chassis system 100 provides front removable daughter cards and unobstructed cooling across the entire set of daughter cards 108.

Figure 2:
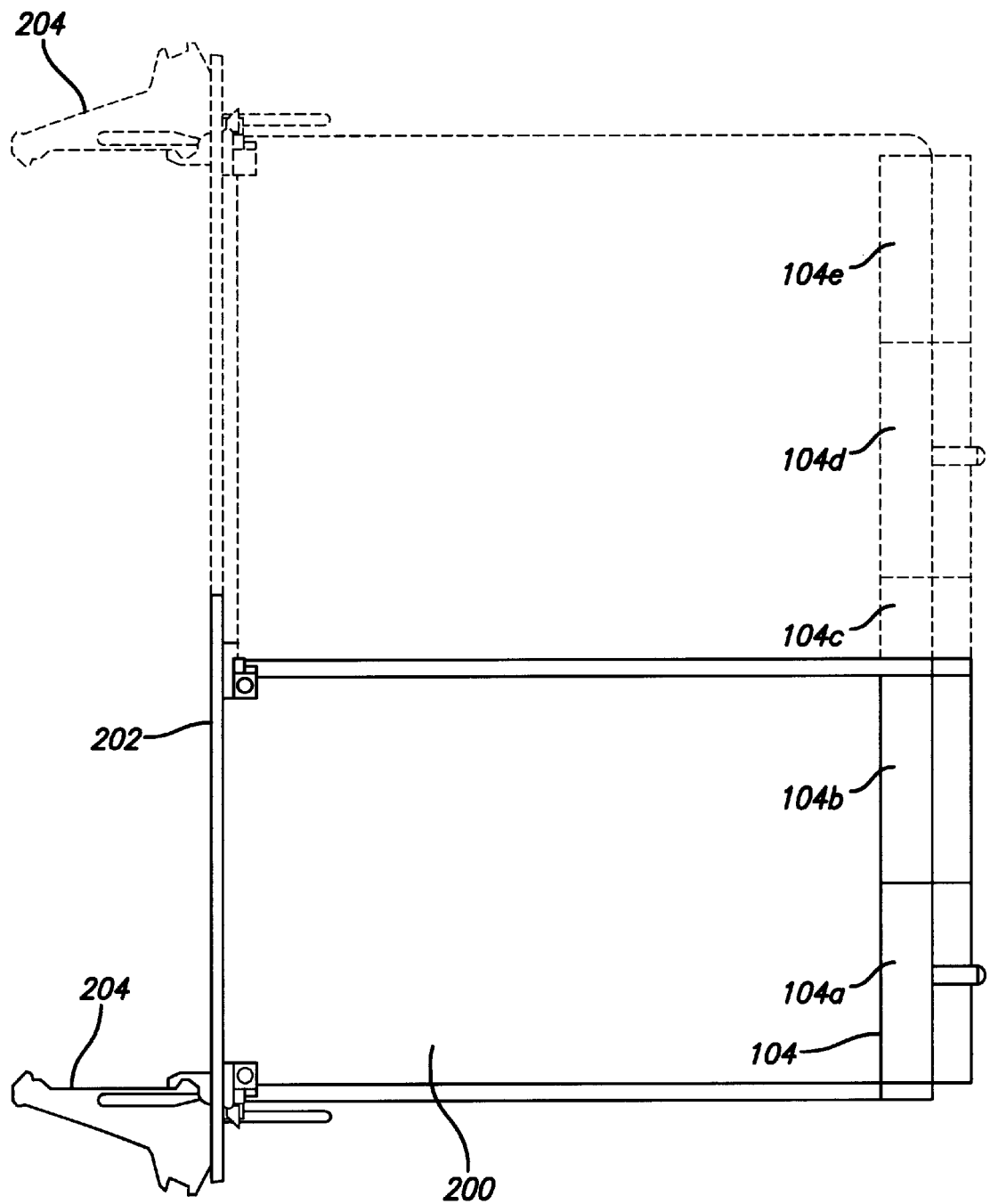
FIG. 2 shows the form factor that is defined for the CPCI daughter card.

Referring to FIG. 2, there is shown the form factor defined for the CPCI daughter card, which is based on the Eurocard industry standard. As shown in FIG. 2, the daughter card 200 has a front plate interface 202 and ejector/injector handles 204. The front plate interface 202 is consistent with Eurocard packaging and is compliant with IEEE 1101.1 or IEEE 1101.10. The ejector/injector handles should also be compliant with IEEE 1101.1. One ejector/injector handle 204 is used for 3U daughter cards, and two ejector/injector handles 204 are used for 6U daughter cards. Note that the connectors 104a–104e are numbered starting from the bottom connector 104a, and that both 3U and 6U daughter card sizes are defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b, and is the minimum as it accommodates the full 64 bit CPCI bus. Specifically, the 104a connectors are reserved to carry the signals required to support the 32-bit PCI bus, hence no other signals may be carried in any of the pins of this connector. Optionally, the 104a connectors may have a reserved key area that can that be provided with a connector "key", which is a pluggable plastic piece that comes in different shapes and sizes, so that the add-on card can only mate with an appropriately keyed slot. The 104b connectors are defined to facilitate 64-bit transfers or for rear panel I/O in the 3U form factor. The 104c[\N]104e connectors are available for 6U systems as shown in FIG. 1. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (i.e., Signal Computing System Architecture (SCSA) or MultiVendor Integration Protocol (MVIP) telephony buses), bridges to other buses (i.e., Virtual Machine Environment (VME) or Small Computer System Interface (SCSI)), or for user specific applications. Note that the CPCI specification defines the locations for all the connectors 104a–104e, but only the signal-pin assignments for the CPCI bus portion 104a and 104b are defined. The remaining connectors are the subjects of additional specification efforts, or can be user defined for specific applications, as described above.

Figure 3:
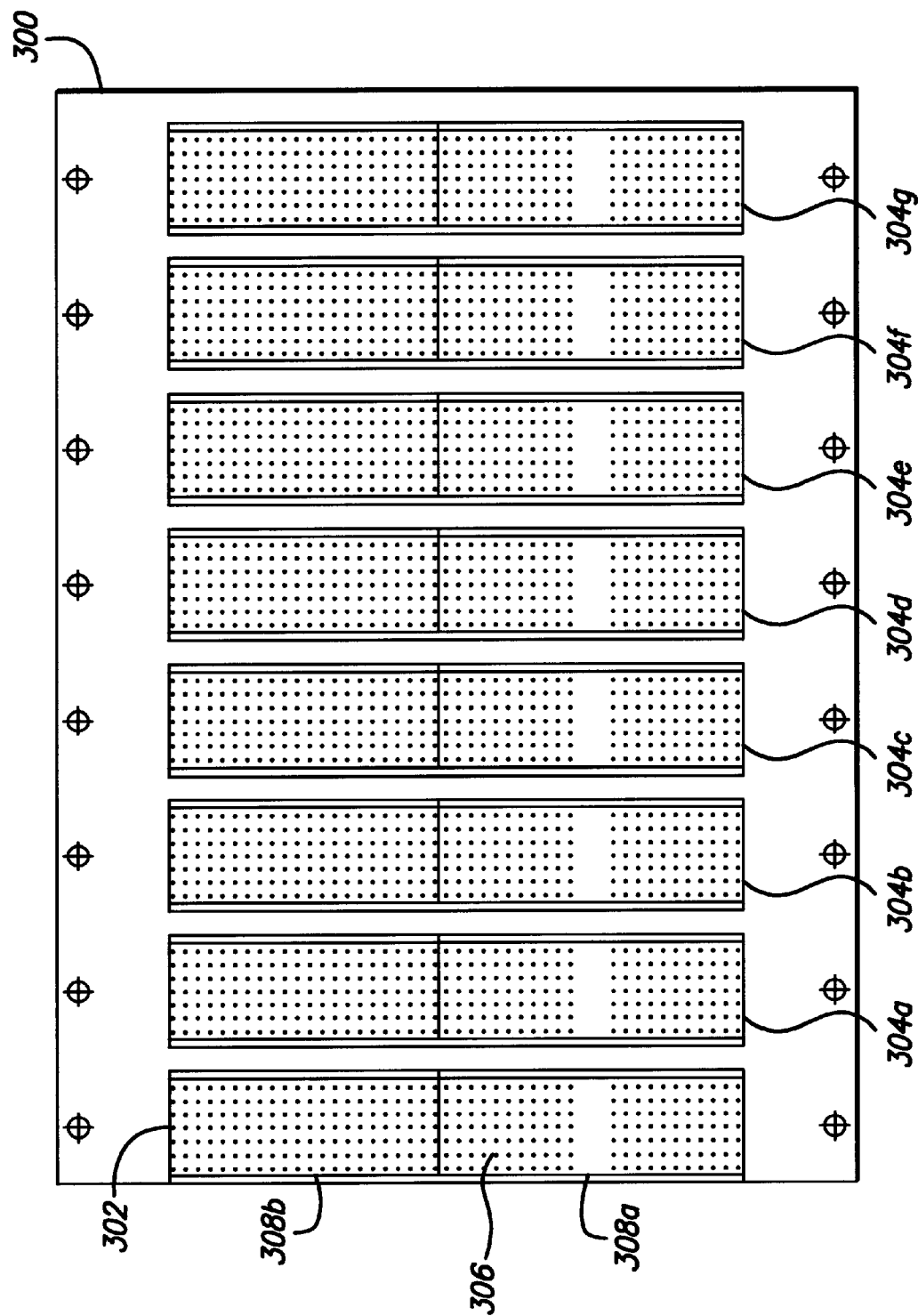
FIG. 3 is a front view of a conventional 3U backplane having eight slots with two connectors each.

Referring to FIG. 3, there is shown a front view of a conventional 3U backplane having eight slots with two connectors each. A CPCI system is composed of one or more CPCI bus segments, where each bus segment includes up to eight CPCI card slots. Each CPCI bus segment consists of one system slot 302, and up to seven peripheral slots 304a–304g. The CPCI daughter card for the system slot 302 provides arbitration, clock distribution, and reset functions for the CPCI peripheral cards on the bus segment. The peripheral slots 304a–304g may contain simple cards, intelligent slaves or PCI bus masters.

The connectors 308a, 308b have connector-pins 306 that project in a direction perpendicular to the backplane 300, and are designed to mate with the front side "active" daughter cards 108 (see FIG. 1), and "pass-through" its relevant interconnect signals to mate with the rear side "passive" input/output (I/O) card(s) (not shown). In other words, the connector-pins 306 allow the interconnected signals to pass-through from the active front side daughter cards to the rear side passive I/O cards.

Referring to FIGS. 4(a) and 4(b), there are shown a front and back view of a conventional CPCI backplane in the 6U form factor, respectively. In FIG. 4(a), four slots 402a–402d are provided on the front side 400a of the backplane 400. In FIG. 4(b), four slots 406a–406d are provided on the back side 400b of the backplane 400. Note that in both FIGS. 4(a) and 4(b) only four slots are provided instead of eight slots as in FIG. 3. Further, it is important to note that each of the slots 402a–402d on the front side 400a have five connectors 404a–404e while each of the slots 406a–406d on the back side 400b have only four connectors 408b–408e. This is because, as in the 3U form factor of the conventional CPCI system, the 404a connectors are provided for 32 bit PCI and connector keying. Thus, they do not have I/O connectors to their rear. Accordingly, the daughter cards that are inserted in the front side slots 402a–402d only transmit signals to the rear transition cards that are inserted in the back side slots 406a–406d through front side connectors 404b–404e.

Referring to FIG. 5, there is shown a side view of the conventional backplane of FIGS. 4(a) and 4(b). As shown in FIG. 5, slot 402d on the front side 400a and slot 406d on the back side 400b are arranged to be substantially aligned so as to be back to back. Further, slot 402c on the front side 400a and slot 406c on the backside 400b are arranged to be substantially aligned, and so on. Accordingly, the front side connectors 404b–404e are arranged back-to-back with the back side connectors 408b–408e. Note that the front side connector 404a does not have a corresponding back side connector. It is important to note that the system slot 402a is adapted to receive the CPU daughter card, and the signals from the system slot 402a are then transmitted to corresponding connector-pins of the peripheral slots 402b–402d. However, a conventional CPCI system does not allow multiple stand-alone computers to be inserted in the multiple slots of the CPCI board.

Figure 6C:
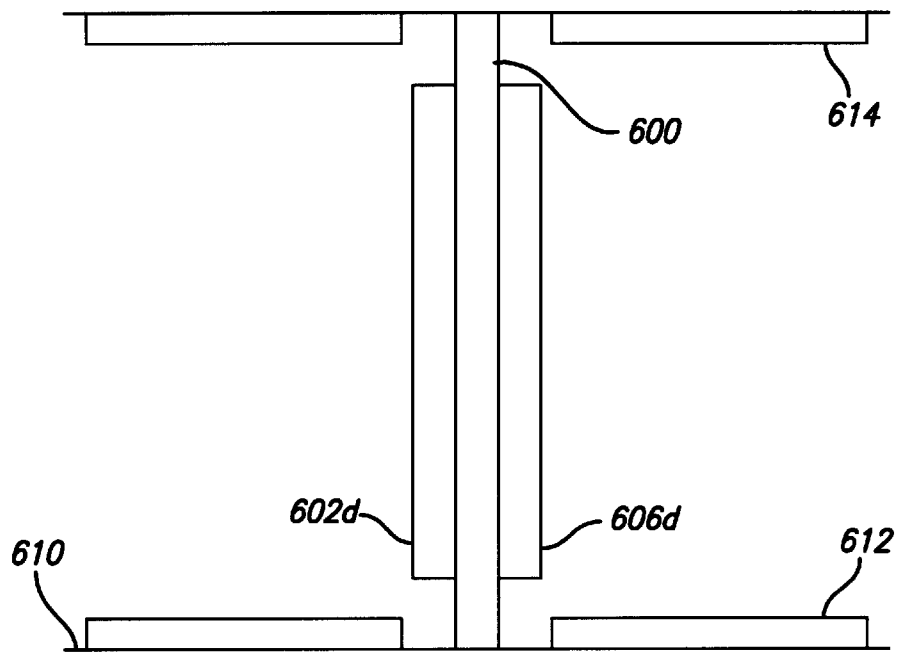
FIG. 6(c) shows a side view of a chassis system according to an embodiment of the invention.

The present invention has the advantage of being able to accommodate a standalone computer for each slot of the CPCI board. Referring to FIGS. 6(a) and 6(b), there are shown a front and back view, respectively, of a CPCI midplane according to an embodiment of the invention. In the present invention, the CPCI circuit board 600 is referred to as the midplane because it is located in the middle of the chassis, and is able to have add-on cards inserted from the front and back. For example, referring to FIG. 6(c), which shows a side view of a chassis according to an embodiment of the invention, the midplane 600 is located at the middle of the chassis 610 having top and bottom guides 614, 612. However, it should be noted that the CPCI circuit board of the present invention may be located in any suitable place on the CPCI chassis. As shown in FIG. 6(a), on the front side 600a of the midplane 600, there are provided four slots 602a–602d having five connectors 604a–604e each. As shown in FIG. 6(b), on the back side 600b of the midplane 600, there are also provided four slots 606a–606d having four connectors 608b–608e each. Note that although only four slots are shown on the front side 600a and back side 600b of the midplane 600, the present invention may include more slots or fewer slots.

Figure 7A:
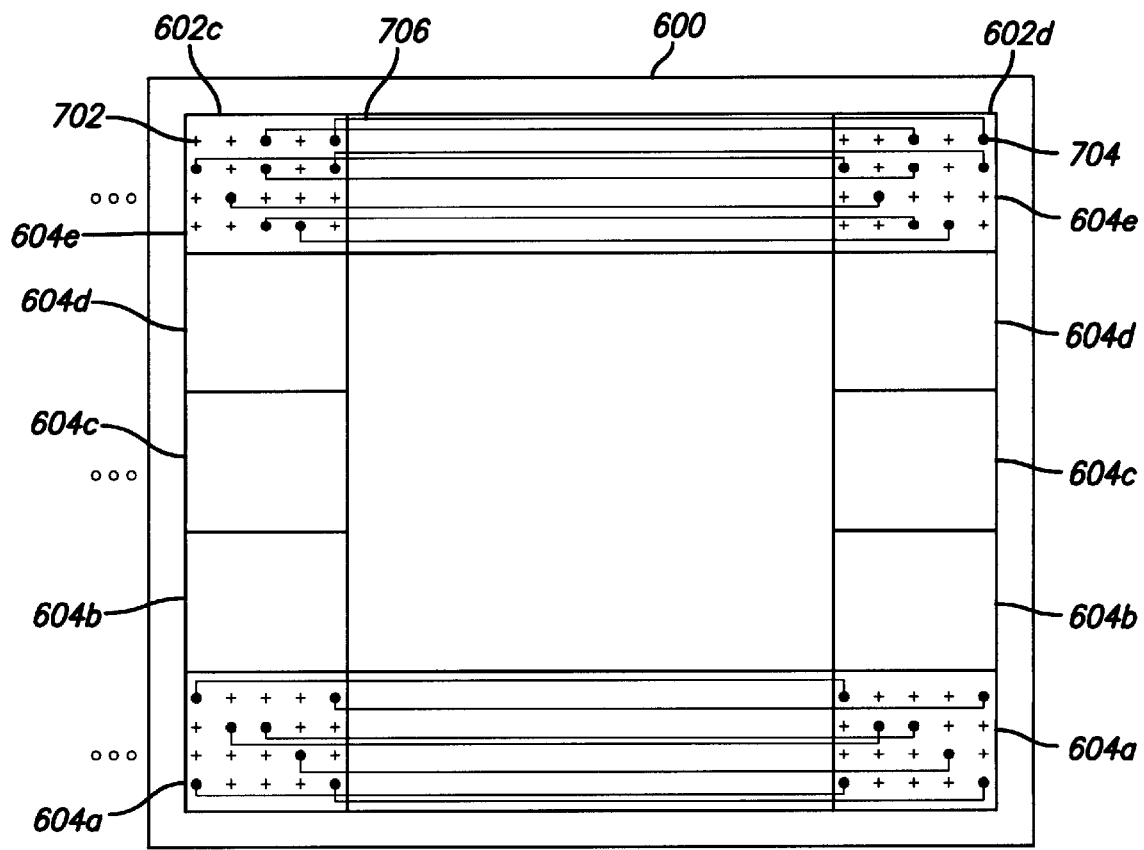
FIG. 7(a) shows a cross-section of the midplane of FIG. 7 taken across the line 7(a)—7(a)

Referring to FIG. 7, there is shown a side view of the midplane of FIGS. 6(a) and 6(b). As illustrated in FIG. 7, the slot 602d on the front side 600a and slot 606d on the back side 600b are arranged to be substantially aligned so as to be back to back. Further, slot 602c on the front side 600a and slot 606c on the back side 600b are arranged to be substantially aligned so as to be back-to-back, and so on. Accordingly, the signals from the CPCI daughter cards that are inserted in the front side slots are transmitted to the I/O cards that are inserted in the back side slots from connectors 604b–604e to connectors 608b–608e, respectively. Note that in the present invention, each slot 602a–602d on the front side 600a is adapted to receive a CPU card so that signals being transmitted on connector-pins of one slot are not shared with the connector-pins of the other slots on the same side, except for the power signals. For example, referring to FIG. 7(a), there is shown a cross-section of the mid-plane of FIG. 7 across the line 7(a)—7(a), and which shows the signal traces of the midplane 600. FIG. 7(a) shows slots 602c and 602d having connectors 604a–604e, respectively. As shown in FIG. 7(a), connector 604e of both slots 602c, 602d have connector-pins 702 represented by +'s which correspond to I/O signal pins, and connector pins 704 represented by dots, which correspond to power signal pins. For illustration, signal traces 706 connect the connector-pins 704 of slot 602c to corresponding connector-pins 704 of slot 602d, while the connector-pins 702 are not electrically connected to any corresponding connector-pins of any different slot. In other words, the signal traces 706 on the midplane 600 only electrically connect the connector-pins 704 that are defined to receive the power signals, and not the connector-pins 702 that are defined for I/O signals.

Because the connector-pins 702 of the slots 602c, 602d in the midplane 600 are not electrically connected to one another, except for the power signal connector-pins 704, each slot 602c, 602d acts as an "isolated" bus. Thus, when a CPU card is inserted in a slot 602a–602d of the midplane 600, the I/O signals are only transmitted between the CPU card and the I/O transition card that is inserted in the corresponding slot that is on the other side of the midplane 600, whereas the power signals are shared with all the other slots 602a–602d. This allows multiple CPU cards to be inserted in the slots 602a–602d of the same midplane 600, yet operate independently. Thus, a plurality of standalone computers can be provided in a single midplane 600 of the present invention, allowing for advantages such as pure multitasking, parallel processing, redundancy, mirroring, back-up, and more computing power within a given board size.

Referring to FIG. 8, there is shown a stand-alone computer in a slot of the midplane of FIG. 7. As shown in FIG. 8, a CPU daughter card 802 is inserted in slot 602d of the midplane 600, and an I/O transition card 804 is inserted in slot 606d of the midplane 600. By having the cards 802, 804 inserted in the slots 602d, 606d, respectively, a stand-alone computer 800 is provided in a single slot of the midplane 600. Further, by inserting additional CPU daughter cards and I/O transition cards in the other slots 602a–602c, 606a–606c, respectively, of the midplane 600, a plurality of stand-alone computers 800 can be connected to the midplane 600.

Referring to FIGS. 9(a) and 9(b), there are shown the arrangement of the connector-pins of the front side and back side connectors according to an embodiment of the invention. As shown in FIGS. 9(a) and 9(b), the connector 604a and connector 608a have a column and row arrangement of connector-pins 900. Note that the arrangement of the connector-pins of the back side connector 608a is a mirror image of the arrangement of the connector-pins of the front side connector 604a. For example, when the slot 602d of the front side 600a is aligned so as to be back to back with the slot 606d of the back side 600b, connector-pin 900 located at column z row 2 of the front side connector 604b is the same connector-pin 900 located at column z, row 2 of the back side connector 608b. Thus, the connector-pins 900 of connectors 604b and 608b are straight pass-through pins. Similarly, the connectors 604b–604e also share corresponding connector-pins with connectors 608b–608e, respectively. Accordingly, the connector-pins 900 are designed to mate with the front side CPU cards and pass-through the relevant interconnected signals to mate with the rear side I/O transition cards.

As described above, the present invention does not interconnect the connector-pins of a slot with the connector-pins of a different slot on the same side of the midplane. Thus, except for the power signals, signals in one slot are isolated from the signals in other slots on the same side of the midplane. Accordingly, on the front side 600a of the midplane 600, CPU cards are pluggable, and on the back side 600b, I/O transition cards having all of the I/O circuitry and electronics are pluggable. Thus, each CPU card and its corresponding I/O transition card comprise a stand-alone computer, and the midplane 600 is able to accommodate multiple stand-alone computers. Note that the rear I/O transition cards that are pluggable into the back side slots are intelligent cards, and include a mass storage device such as a hard disk 1002, and may further include other components such as Ethernet controllers 1004, a serial port 1006, a parallel port 1008, a video controller or other types of controllers 1010, as shown in FIG. 10.

Having thus described different embodiments of the present invention, it should be apparent to those skilled in the art that certain advantages which may be achieved by the present invention. It should also be appreciated that various modifications, adaptations, and alternative embodiments thereof may be made within the scope and spirit of the present invention. For example, a CPCI midplane has been illustrated, but it should be apparent that the inventive concepts described above would be equally applicable to other types of circuit boards, computer systems or computer busses. The invention is further defined by the following claims.

What is claimed is:

1. A computer rack comprising:
    a circuit board for accommodating a plurality of stand-alone computers, said circuit board having a front side and a back side;
    a first plurality of slots coupled to said front side, and a second plurality of slots coupled to said back side, said first and second plurality of slots being arranged such that corresponding ones of said first and second slots are in alignment together;
    a plurality of connectors affixed to said circuit board in alignment with said first and second plurality of slots, and each one of said plurality of connectors having respective pass-through connector-pins that extend into each slot of said first and second plurality of slots;
    wherein certain ones of said connector-pins allocated to carry power signals are commonly connected among said plurality of connectors, and remaining ones of said connector-pins with respect to a particular slot are electrically isolated from connector-pins with respect to another slot on the same one of said front side and said back side.

2. The computer bus rack of claim 1, wherein said slots on said front side are adapted to receive a CPU card and said slots on said back side are adapted to receive I/O transition cards.

3. The computer bus rack of claim 1, wherein said circuit board further comprises a CPCI midplane.

4. The computer bus rack of claim 1, wherein said circuit board further comprises a CPCI backplane.

5. The computer bus rack of claim 2, wherein said I/O transition cards are active cards including at least one of a hard disk drive, Ethernet controller, parallel port, serial port, video controller, and other type of controller.

6. A computer system, comprising:
    a rack including a common circuit board having a front side and a back side, said rack further having a plurality of slots disposed at said front and back sides, said common circuit board further comprising a plurality of connectors corresponding respectively to said plurality of slots;
    a plurality of CPU daughter cards adapted to be plugged into said slots of said front side; and
    a plurality of I/O transition cards adapted to be plugged into said slots of said back side;
    wherein power signals are shared by each of said plurality of connectors of each slot, and I/O signals are only transmitted between daughter cards on said front side and a corresponding I/O transition card on said back side, wherein corresponding pairs of said CPU daughter cards and said I/O transition cards provide respective stand-alone computers of said computer system.

7. The computer system of claim 6, wherein said I/O cards further comprise active cards including at least one of a hard disk drive, Ethernet controller, parallel port, serial port, video controller, and other type of controller.

8. The computer system of claim 6, wherein said circuit board further comprises a CPCI midplane.

9. The computer system of claim 6, wherein said circuit board further comprises a CPCI backplane.

10. The computer system of claim 6, wherein said connectors include pass-through connector-pins.

11. The computer system of claim 6, wherein each of said connectors further include first connector-pins allocated to carry power signals and second connector-pins allocated to carry other signals, said first connector-pins are commonly connected among said plurality of connectors, and said second connector-pins are electrically isolated from corresponding second connector-pins of other slots on the same one of said front side and said back side.

12. A computer system, comprising:
    a rack including a common circuit board having a front side and a back side, said rack further having a plurality of slots disposed at said front and back sides, said common circuit board further comprising a plurality of connectors corresponding respectively to said plurality of slots;
    a first CPU daughter card adapted to be plugged into one of said slots of said front side; and
    a first I/O transition card adapted to be plugged into one of said slots of said back side;
    wherein each of said plurality of connectors further include first connector-pins allocated to carry power signals and second connector-pins allocated to carry I/O signals, said first connector-pins are commonly connected for each of said plurality of connectors, and said second connector-pins are electrically isolated from corresponding second connector-pins of other slots on the same one of said front side and said back side, wherein said corresponding pairs provide respective stand-alone computers of said computer system.

13. The computer system of claim 12, wherein said first I/O card further comprises active cards including at least one of a hard disk drive, Ethernet controller, parallel port, serial port, video controller, and other type of controller.

14. The computer system of claim 12, wherein said circuit board further comprises a CPCI midplane.

15. The computer system of claim 12, wherein said circuit board further comprises a CPCI backplane.

16. The computer system of claim 12, wherein said connectors include pass-through connector-pins.

* * * * *